United States Patent [19]

Doty

[11] Patent Number: 4,885,067

[45] Date of Patent: Dec. 5, 1989

[54] IN-SITU GENERATION OF VOLATILE COMPOUNDS FOR CHEMICAL VAPOR DEPOSITION

[75] Inventor: Fred P. Doty, Earlysville, Va.

[73] Assignee: Santa Barbara Research Center, Goleta, Calif.

[21] Appl. No.: 355,050

[22] Filed: May 15, 1989

Related U.S. Application Data

[63] Continuation of Ser. No. 91,227, Aug. 31, 1987, abandoned.

[51] Int. Cl.[4] .............................................. C23C 16/00
[52] U.S. Cl. .......................... 204/157.6; 204/157.75; 118/719; 427/252
[58] Field of Search ............... 118/715, 719; 427/252; 204/157.6, 157.75

[56] References Cited

U.S. PATENT DOCUMENTS

| | | | |
|---|---|---|---|
| 4,365,587 | 12/1982 | Hirose et al. | 118/719 X |
| 4,368,689 | 1/1983 | Jones | 118/715 X |
| 4,623,426 | 11/1986 | Peters | 427/54.1 X |
| 4,714,627 | 12/1987 | Puddephatt et al. | 427/252 X |
| 4,726,320 | 2/1988 | Ichikawa | 118/715 X |
| 4,732,793 | 3/1988 | Itoh | 422/54.1 |

FOREIGN PATENT DOCUMENTS

| | | |
|---|---|---|
| 0140625 | 5/1985 | European Pat. Off. . |
| 8503460 | 8/1985 | European Pat. Off. . |
| 0229707 | 7/1987 | European Pat. Off. . |

*Primary Examiner*—Stephen J. Kalafut
*Attorney, Agent, or Firm*—W. C. Schubert; W. K. Denson-Low

[57] ABSTRACT

Method and apparatus for the in-situ generation of volatile compounds within the process piping of a CVD system. A source of molecules is located upstream from a solid material which is desired to be deposited within a reactor chamber of the system. The molecules are acted upon by a disassociation means, such as a pyrolytic, plasma discharge, or radiation means, to form highly reactive free radicals. These free radicals are fragments of molecules containing unpaired electrons. In accordance with the invention, these highly reactive radicals are generated near the solid source material in a gas stream which transports the radicals to the solid material before the radicals recombine with one another to form unreactive molecules. The free radicals react with the solid source material to form volatile compounds, such as organometallic compounds, which are subsequently conveyed to the reaction chamber of the system for deposition therein.

20 Claims, 2 Drawing Sheets

IN-SITU GENERATION OF VOLATILE COMPOUNDS FOR CHEMICAL VAPOR DEPOSITION

This application is a continuation of application Ser. No. 07/091,227 filed Aug. 31, 1987, now abandoned.

FIELD OF THE INVENTION

The present invention relates to chemical vapor deposition (CVD) and, in particular, to the in-situ generation of volatile compounds for use in a CVD reactor.

BACKGROUND OF THE INVENTION

CVD reactors of the prior art, such as metalorganic chemical vapor deposition (MOCVD) reactors, have typically used reservoirs of previously prepared organometallic compounds as sources for reactants. As is well known, these compounds may be extremely toxic and pyrophoric and, in general, are different to handle and store. The volatility, reactiveness, and the tendency of these compounds to readily decompose when exposed to air and moisture has presented a formidable problem. In addition, a complex array of process piping and valves is typically required to deliver the needed quantities of reactants to the MOCVD reactor. Also, separate temperature controls are generally required for each such source of reactants.

MOCVD systems are used, typically, for the deposition of type III-IV and II-VI semiconductors, as well as ceramics, metals and metal alloys. The volatile organometallic source compounds in these MOCVD systems are typically prepared as a gas or a high vapor pressure liquid which is stored in a reservoir. A carrier gas such as hydrogen is "bubbled" through the reservoir and the source compund and the carrier gas are subsequently introduced by means of metered valves into the reactor, or deposition, chamber. Within the chamber the volatile compound or compounds are decomposed and the desired material is deposited therein. The delivery of a known or reproducible amount of reactant to the deposition chamber requires independent temperature and carrier gas flow control mechanisms for each type of required reactant.

As can be appreciated from the foregoing, the required storage of relatively large quantities of these highly toxic and unstable organometallic source compounds has presented a serious problem. In addition, the implementation of the complex piping and process control mechanisms required to introduce desired amounts of these organometallics into the MOCVD reactor has also presented a serious problem.

One further disadvantage of these systems of the prior art is that the use of liquid reservoirs of source compunds in conjunction with a carrier gas "bubbler" is inappropriate in a zero gravity environment such as is found in a spacecraft. Thus, the use of such prior art CVD systems to produce, for example, high-quality semiconductor devices in an orbiting production facility is foreclosed by the reliance of such systems of the prior art on gravitational force for proper operation.

SUMMARY OF THE INVENTION

The foregoing problems are overcome and other advantages are realized by a CVD system which, in accordance with the apparatus and method of the invention, allows for the in-situ generation of volatile compounds, such as organometallic compounds, within the process piping of the CVD system. In accordance with the invention, a source of molecules is located upstream from a source of solid material which is to be deposited in the reactor chamber, the solid material being in communication with an interior portion of the process piping. The molecules, for example organic molecules, are acted upon by a disassociation means, such as a pyrolytic, plasma discharge, or radiation means, to form highly reactive free radicals. These free radicals are fragments of the organic molecules and contain unpaired electrons. These highly reactive radicals are generated near the solid material in a gas stream which transports the radicals to the solid material before the radicals recombine with one another to form unreactive molecules. The free radicals react with the atoms of the solid material to form, for example, organometallic compounds which are subsequently conveyed to the reactor chamber of the system wherein the atoms are deposited.

In one embodiment of the invention a pyrolysis reaction is utilized to form free radicals within a portion of the CVD process piping. The pyrolysis reaction is accomplished by a resistive heating element which surrounds the portion of the process piping, the heating element creating a high temperature region which acts to form free radicals from the organic source molecules. In other embodiments of the invention the free radicals are created by an electrical discharge which produces a plasma region within the process piping, or by an ultraviolet light source, the radiation from the light source creating the free radicals.

After being so generated, the free radicals are carried downstream by a carrier gas flow and pass over the surface of the solid source material, the material containing a material which is desired to be deposited within the reactor chamber. The free radicals react with the surface of the material such that atoms of the material bind to the free radicals and are subsequently conveyed into the reactor chamber where the atoms may be deposited as films or thin layers, as is typically done within aa CVD reactor chamber. Bulk crystal growth and whisker growth may also be achieved in this manner.

In accordance with the invention, a single stream of free radicals within a portion of a primary process tube may be subsequently divided by branches provided from the primary process tube such that each subdivided stream may come in contact with a different desired solid compound or element, thus, a great simplification is achieved in the generation of such organometallics.

Alternatively a single solid source material comprised of, for example, an alloy containing a plurality of desired source materials may be utilized within the primary process tube. Thus, a plurality of volatile compounds may be simultaneously generated by a single stream of free radicals.

The use of the apparatus and method of the invention obviates the need for the storage of these toxic and highly reactive organometallics, instead, the organometallics are generated as required within the process piping of the CVD system itself.

DETAILED DESCRIPTION OF THE INVENTION

Figure 1:
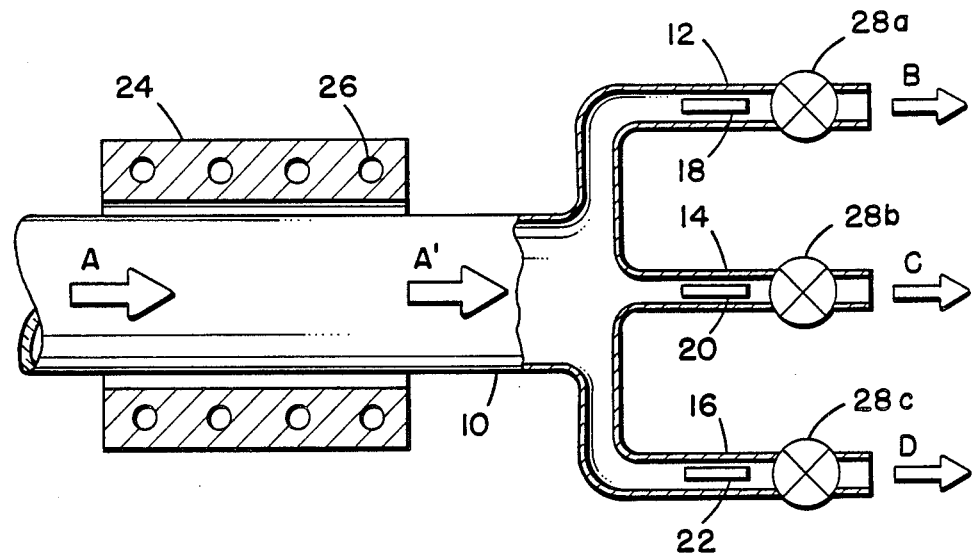
FIG. 1 illustrates a portion of a process tube which allows for the pyrolitic generation of free radicals.

Referring now to FIG. 1, there is shown a portion of the process piping for a chemical vapor deposition (CVD) reactor system. A primary portion of a process tube 10 has a plurality of branches, or secondary portions, projecting therefrom, shown in FIG. 1 as tubes 12, 14 and 16. Although three such branches are shown in the Figures, it is understood that more or less than three may be employed, depending upon the requirements for a particular application. The use of three such branches advantageously provides for three separate streams of highly reactive free radicals to be provided to three separate solid sources, shown generally, as 18, 20 and 22. Tube 10 and the branches thereof are comprised of a suitable refractory material such as quartz. Surrounding a portion of tube 10 is a pyrolitic disassociation means such as a resistive heating element 24 having a plurality of resistive heater windings 26 contained therein. Element 24 is electrically connected to a source of heater power (not shown) in order that the portion of tube 10 contained within element 24 may be raised to an elevated temperature. The arrow A indicates the direction of flow of a gas stream containing molecules to be dissociated into free radicals, the source of the molecules being provided by a suitable means at an upstream portion (not shown). The molecules may be organic molecules or inorganic molecules such as hydrogen. As the gas stream A passes through the portion of tube 10 within element 24, a pyrolytic reaction occurs due to the elevated temperature of this portion of the tube 10. As a result, the molecules within the stream A are disassociated into a stream of free radicals, shown as the arrow A'. This stream of free radicals A' is divided within the branches 12, 14 and 16 of tube 10 such that each of the solid materials 18, 20 and 22 has a portion of a free radical stream A' passing over at least one surface thereof. Each such source of solid material may be comprised of a metal, for example antimony or cadmium, a non-metal, such as silicon or tellurium, or an alloy. The solid material may also be in the form of an elemental source of the desired material, or may comprise compounds of the desired material, or a compound comprised of two or more desired materials. In addition, a liquid material such as mercury may be employed.

In accordance with the invention, the stream of free radicals interacts with the surface of the solid material such that an atom of the solid material is bonded to, typically, more than one of the free radicals passing thereover. The resulting stream of gas in each of the branches, shown as the arrows B, C and D, therefore contains, for example, organometallic molecules which are carried to a downstream region of the CVD reactor system (not shown) where vapor deposition occurs. A carrier gas stream may also be included as part of the gas sream A within the tube 10 for transporting the free radicals and the volatile product molecules to the downstream portion. A plurality of metering valves 28a, 28b and 28c may also be included for selectively allowing or inhibiting the flow of gas streams B, C and D, respectively.

The branches of the process tube make it possible to have a single radical source provide free radicals to a plurality of separate solid sources. In this manner ternary materials such as CdZnTe and CdMnTe can be deposited using elemental metallic sources. It is also possible to use compounds such as HgTe or HgZnTe to deposit binary or ternary materials.

For example, it has been found that the half-life of methyl radicals (CH$_3$.) is approximately $10^{-2}$ seconds. This half-life is adequate for the radicals to form volatile antimony compounds with a source of solid antimony which is located approximately 37 centimeters downstream from the portion of the process tube where the free radicals are generated. The formation of these antimony compounds is found to occur at an appreciable rate. In general, if alkyl radicals are generated near a solid element or compound, they will readily react with the element or compound to form volatile, easily pyrolysed compounds which have a carbon atom bonded directly to a atom of the solid or compound.

Of the many possible pyrolysis reactions which may form free radicals, two examples are now given. Ethane, a typical paraffin, decomposes above 800° C. to yield methyl

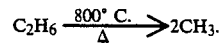

which reacts directly with solid metallic source materials to yield methylated compounds.

Another possible pyrolysis reaction, which is attractive due to the relatively low temperature required, is that of aromethane

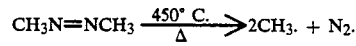

In general, such reactions take the form:

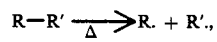

then nR. + A(s)→R$_n$A(g)

where R,R' can be H, alkyl groups, oxygen bearing groups forming peroxides or ethers, etc.

Figure 2:
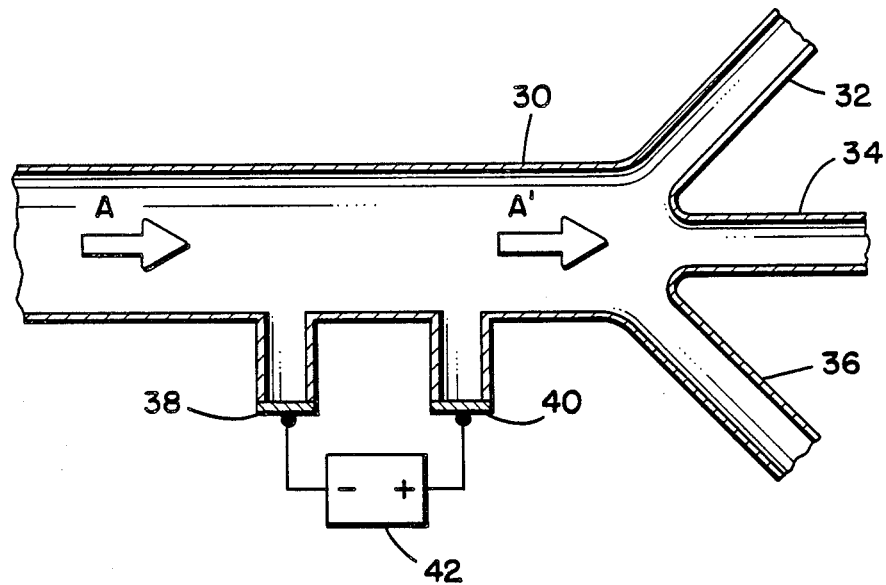
FIG. 2 illustrates a portion of a process tube which allows for the generation of free radicals by plasma discharge.

Referring now to FIG. 2 there is shown another embodiment of the present invention. As in FIG. 1, a portion of a process tube 30 has a plurality of branches 32, 34 and 36. A stream of organic molecules A enters a region of the tube 30 from an upstream source (not shown) of organic molecules. A pair of electrodes 38 and 40 are connected to a source of discharge voltage 42, the magnitude of the voltage being sufficient to create a plasma region within the tube 30 between the two electrodes 38 and 40. The stream A as it passes through the plasma created between electrodes 38 and 40 is disassociated into a stream of organic radicals A' which are subsequently conveyed to a plurality of solid sources such as is depicted in FIG. 1.

Figure 3:
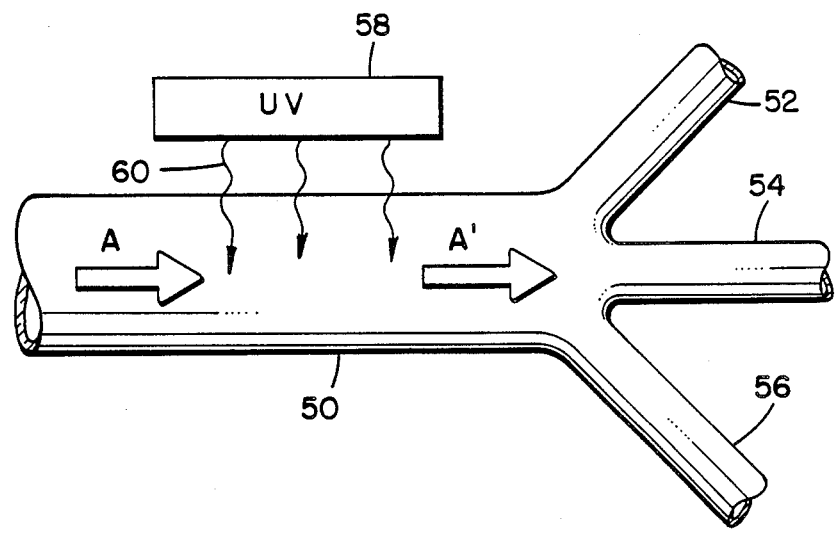
FIG. 3 illustrates a portion of a process tube which allows for the generation of free raicals by a source of ionizing radiation.

FIG. 3 shows yet another embodiment of the present invention wherein a process tube 50 having a plurality of branches 52, 54 and 56 is provided with a source of ionizing radiation, the radiation in FIG. 3 being depicted as ultraviolet (UV) radiation. An UV source 58 may be positioned adjacent to the tube 50 in order that the UV radiation, shown as the arrows 60, may enter the tube 50. Of course, in the embodiment of the invention shown in FIG. 3 the tube 50 must be comprised of a material suitable for admitting the radiation 60 therein. Alternatively, the source 58 may be incorporated within the tube 50. As has been previously described, a flow of organic molecules A passes through this region of tube 50 where the UV radiation 60 causes the molecules to be disassociated into free organic radicals, shown as the arrow A'. The free radicals are subsequently conveyed to separate sources of solid material (not shown) by the branches 52, 54 and 56.

In the embodiment of FIG. 3, the organic molecules A may be comprised of $(CH_3)_3CO-OC(CH_3)_3$ which, under the influence of the UV radiation 60, is disassociated into 2 $C_4H_9O$.

In general, if the disassociation means chosen for a given application acts by pyrolysis or by plasma discharge, substantially all known organic molecules may be disassociated thereby into a stream of free radicals. If, however, a source of ionizing radiation is employed, such as UV radiation, selected organic molecules may need to be employed, the molecules being selected for their susceptibility to breakdown induced by the radiation.

Thus, it may be seen that the use of the apparatus and method of the present invention allows for the in-situ generation of highly reactive free organic radicals within the process piping of a CVD reactor. Such in-situ generation of these radicals eliminates the requirement for storing relatively large quantities of organometallics within or near the reactor system. In accordance with the invention, after being generated the free radicals interact with the solid source material in order to generate a supply of organometallics for deposition within the reactor. The elimination of reservoirs of liquid organometallics further results in the elimination of the typically complex temperature and metering controls which are required to introduce known or reproducible quantities of organometallics into the reactor. Instead, relatively simple flow controllers may be employed downstream from the site where the organometallics are generated within the piping, the flow controllers permitting desired amounts of organometallics to pass through. The elimination of these reservoirs of volatile compounds also provides for a CVD system which is particularly well adapted for use in a zero gravity environment.

As has been previously mentioned, the method and apparatus of the invention may be utilized with a wide variety of solid source materials, both metallic and nonmetallic, and with a variety of free radicals species such as, for example, atomic hydrogen.

One particular volatile compound that is especially desireable to generate is hydrogen telluride which, due to its instability, is difficult to store in the reservoir-type CVD systems of the prior art. The use of the invention allows for the in-situ generation of hydrogen telluride in an "on demand" basis, thereby eliminating such a storage requirement.

In general, a desired tellurium compound in solid form is reacted with free radicals of atomic hydrogen in accordance with the formula

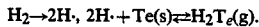

The hydrogen telluride is subsequently decomposed within the CVD reactor by conventional means in order to deposit the desired tellurium compound.

Also, solid compounds or mixtures comprised of two or more materials which are desired to be deposited may be employed as the solid source material in accordance with the general formula:

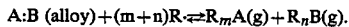

A specific example of this formula is:

Figure 4:
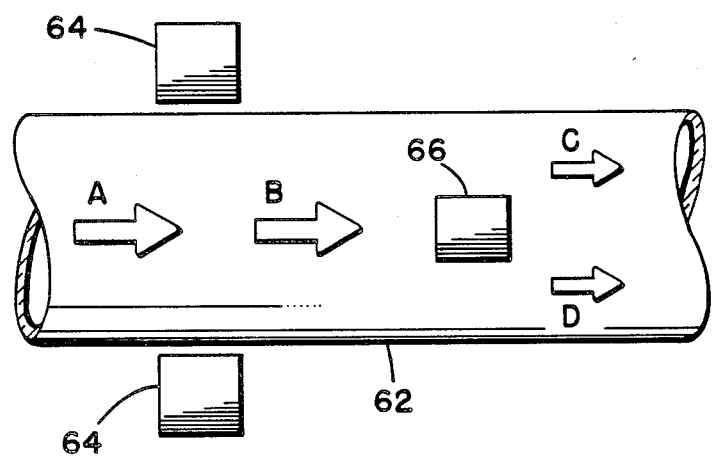
FIG. 4 illustrates a portion of a process tube which allows for the generation of one or more desired volatile compounds from a single solid source material.

This feature of the invention is advantageous in that it provides for the in-situ generation of two or more volatiles within one portion of the process piping, thus reducing the required amount and complexity of the piping and the associated components, such as flow controllers. As illustrated in FIG. 4, a portion of a process pipe 62 has a disassociation means 64 coupled thereto, the disassociation means 62 comprising, for example, the pyrolitic disassociation means of FIG. 1. A flow of molecules A is disassociated by means 64 to form a flow of free radicals B. These radicals B react with a solid source material 66 comprised of, in accordance with the foregoing example, a CdZn alloy. The resultant flow of volatile compounds comprises cadmium volatiles C and zinc volatiles D which are transported to the CVD reactor (not shown) wherein the volatiles C and D are decomposed by conventional techniques in order to deposit the desired Cd and Zn.

It should be appreciated that the use of the preseent invention also provides for the in-situ generation of volatiles which are not commercially available due to, for example, their inherent instability.

While the present invention has been described in the context of preferred embodiments thereof, it will be readily apparent to those skilled in the art that modifications and variations can be made therein without departing from the spirit and scope of the present invention. For example, one such modification may be the replacement of the resistive heating element of FIG. 1 with another pyrolytic disassociation means such as a flame directed against the outer walls of the process tube. Accordingly, it is not intended that the present invention be limited to or by the specifics of the foregoing description of the preferred embodiments, but rather only by the scope of the invention as defined in the claims appended hereto.

What is claimed is:

1. A method of generating a volatile organic compound for use in a CVD system, comprising the steps of:
   providing a source of organic molecules;
   introducing the molecules into a predetermined region of a process pipe coupled to the system;
   disassociating the molecules within the predetermined region to generate free radicals therefrom;
   passing the radicals over a solid source of material, the material being a material desired to be deposited within the system, the
   directing the volatile compound into a portion of the system wherein the volatile compound is decomposed and the material is deposited.

2. The method of claim 1 wherein the step of disassociating is accomplished by heating the predetermined region to a temperature sufficient to disassociate the molecules into free radicals.

3. The method of claim 1 wherein the step of disassociating is accomplished by generating an electrical plasma within the predetermined region.

4. The method of claim 1 wherein the step of disassociating is accomplished by irradiating the predetermined region with a source of ionizing radiation, the radiation having sufficient energy to disassociate the molecules into free radicals.

5. The method of claim 4 wherein the radiation is generated by an ultraviolet radiation source.

6. The method of claim 1 wherein the step of introducing further comprises a step of providing a carrier gas flow for carrying the molecules into the predetermined region.

7. The method of claim 1 wherein the step of passing is accomplished at a time before the free radicals have substantially recombined into unreactive molecules.

8. A method of generating a plurality of volatile organic compounds within CVD system, comprising the steps of:
generating a primary supply of organic free radicals within a portion of a process pipe of the system
dividing the supply into a plurality of secondary supplies of organic free radicals;
passing each one of the secondary supplies over a respective material which is desired to be deposited within the system, each of the secondary supplies reacting with the associated material to generate a volatile organic compound; and
selectively directing each of the volatile organic compounds so generated into the system for deposition of the material.

9. The method of claim 8 wherein the step of dividing is accomplished by providing the process pipe with a plurality of branches projecting therefrom.

10. The method of claim 9 wherein the step of passing further comprises a step of providing within each one of the branches one of the materials desired to be deposited within the system.

11. The method of claim 10 wherein the step of selectively directing is accomplished by providing each of the branches with a valve means operable for passing a desired amount of a volatile organic compound therethrough.

12. Apparatus for generating volatile organic compounds for use in a reactor chamber of an MOCVD system comprising:
processing piping in communication with said reactor chamber;
means for providing a source of organic molecules to a portion of the process piping;
means for disassociating said organic molecules into organic free radicals, said disassociating means being operable for disassociating said molecules within said portion of said process piping; and
means for contacting said radicals with at least one source of solid material such that said radicals react with and bond to said material whereby one or more volatile compounds containing atoms from said material are generated within said process piping.

13. The apparatus of claim 12 wherein said disassociating means is a heating element thermally coupled to said portion of said process piping.

14. The apparatus of claim 12 wherein said disassociating means is a first and a second electrode disposed within said process piping, said electrodes being electrically coupled to a voltage source operable for generating a plasma region between said electrodes and within said portion of said process piping.

15. The apparatus of claim 12 wherein said disassociating means is a source of ionizing radiation radiatively coupled to said portion of said process piping.

16. The apparatus of claim 12 wherein said portion of said process piping has a plurality of branches projecting therefrom, each of said branches having an interior region communicating with a solid source of atoms and conveying a portion of said free radicals therethrough such that a plurality of volatile compounds are substantially simultaneously generated within each of said branches.

17. The apparatus of claim 16 further comprising a plurality of valve means, each one of which is coupled to a respective one of said branches for selectively passing an associated volatile compound therethrough.

18. The apparatus of claim 12 wherein said source of solid material is an alloy.

19. Apparatus for generating volatile organic compounds for use in a reactor chamber of an MOCVD system comprising:
process piping in communication with said reactor chamber;
means for providing a stream of organic molecules to said process piping flowing toward said reactor chamber;
means for disassociating said molecules flowing within said process piping into free radicals, said means operable on said molecules within a portion of said process piping; and
at least one source of solid material located within said process piping and downstream of said portion of said process piping where said means for disassociating is operable, said source of solid material for contacting said radicals such that said radicals react with and bond to said material, whereby one or more volatile organic compounds containing atoms from said material are generated within said process piping.

20. An apparatus as in claim 19 wherein said process piping divides into a plurality of branches after said portion of said process piping on which said means for disassociation is operable, each branch containing a source of solid material.

* * * * *